United States Patent
Minami

(10) Patent No.: US 12,328,101 B2
(45) Date of Patent: Jun. 10, 2025

(54) AMPLIFICATION DEVICE AND MATCHING CIRCUIT BOARD

(71) Applicant: Sumitomo Electric Device Innovations, Inc., Yokohama (JP)

(72) Inventor: Tadashi Minami, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 668 days.

(21) Appl. No.: 17/614,952

(22) PCT Filed: Mar. 30, 2021

(86) PCT No.: PCT/JP2021/013568
§ 371 (c)(1),
(2) Date: Nov. 29, 2021

(87) PCT Pub. No.: WO2021/200963
PCT Pub. Date: Oct. 7, 2021

(65) Prior Publication Data
US 2022/0239260 A1 Jul. 28, 2022

(30) Foreign Application Priority Data
Mar. 30, 2020 (JP) .................. 2020-060465

(51) Int. Cl.
*H03F 1/02* (2006.01)
*H03F 1/08* (2006.01)
(Continued)

(52) U.S. Cl.
CPC ............. *H03F 1/086* (2013.01); *H03F 3/193* (2013.01); *H03F 3/21* (2013.01); *H03F 2200/222* (2013.01); *H03F 2200/387* (2013.01)

(58) Field of Classification Search
CPC . H03F 1/086; H03F 3/193; H03F 3/21; H03F 2200/222; H03F 2200/387;
(Continued)

(56) References Cited

U.S. PATENT DOCUMENTS

2002/0186091 A1   12/2002   Maeda et al.
2007/0147012 A1    6/2007   Tanaka
(Continued)

FOREIGN PATENT DOCUMENTS

JP    63-086904 A    4/1988
JP    2002-076528 A  3/2002
(Continued)

*Primary Examiner* — Andrea Lindgren Baltzell
*Assistant Examiner* — Khiem D Nguyen
(74) *Attorney, Agent, or Firm* — Volpe Koenig

(57) ABSTRACT

An amplification device includes a base substrate, an amplification element, and a matching circuit board. The amplification element is mounted on the base substrate. The matching circuit board is mounted on the base substrate and includes a circuit pattern which is electrically connected to the amplification element. The matching circuit board includes a first side surface and a second side surface each extending in the longitudinal direction of the matching circuit board. A first recess is provided in the first side surface. A second recess facing the first recess is provided in the second side surface.

10 Claims, 14 Drawing Sheets

(51) Int. Cl.
*H03F 3/193* (2006.01)
*H03F 3/21* (2006.01)

(58) Field of Classification Search
CPC ........... H01L 24/48; H01L 2224/48091; H01L
2224/49175; H01L 2924/00014; H01L
23/562; H01L 24/49; H01L 2224/32245;
H01L 2224/48195; H01L 2224/73265;
H01L 2924/1306; H01L 2924/13064;
H01L 2924/1421; H01L 23/047; H01L
2223/6611; H01L 2223/6655; H01L
2924/19041; H01L 2924/19105; H01L
2924/19107; H01L 2924/30105; H01L
2924/30107; H01L 2924/30111; H01L
2924/3511; H01L 2924/3512; H01L 23/66
USPC ............................. 330/277, 307, 295, 124 R
See application file for complete search history.

(56) References Cited

U.S. PATENT DOCUMENTS

| | | | |
|---|---|---|---|
| 2015/0280697 A1* | 10/2015 | Takagi | H03K 5/1252 |
| | | | 327/551 |
| 2016/0336255 A1 | 11/2016 | Miyawaki et al. | |
| 2018/0145023 A1 | 5/2018 | Hasegawa et al. | |

FOREIGN PATENT DOCUMENTS

| | | | |
|---|---|---|---|
| JP | 2002-335136 A | 11/2002 | |
| JP | 2005-129552 A | 5/2005 | |
| JP | 2016-219461 A | 12/2016 | |
| JP | 2018-085613 A | 5/2018 | |

* cited by examiner

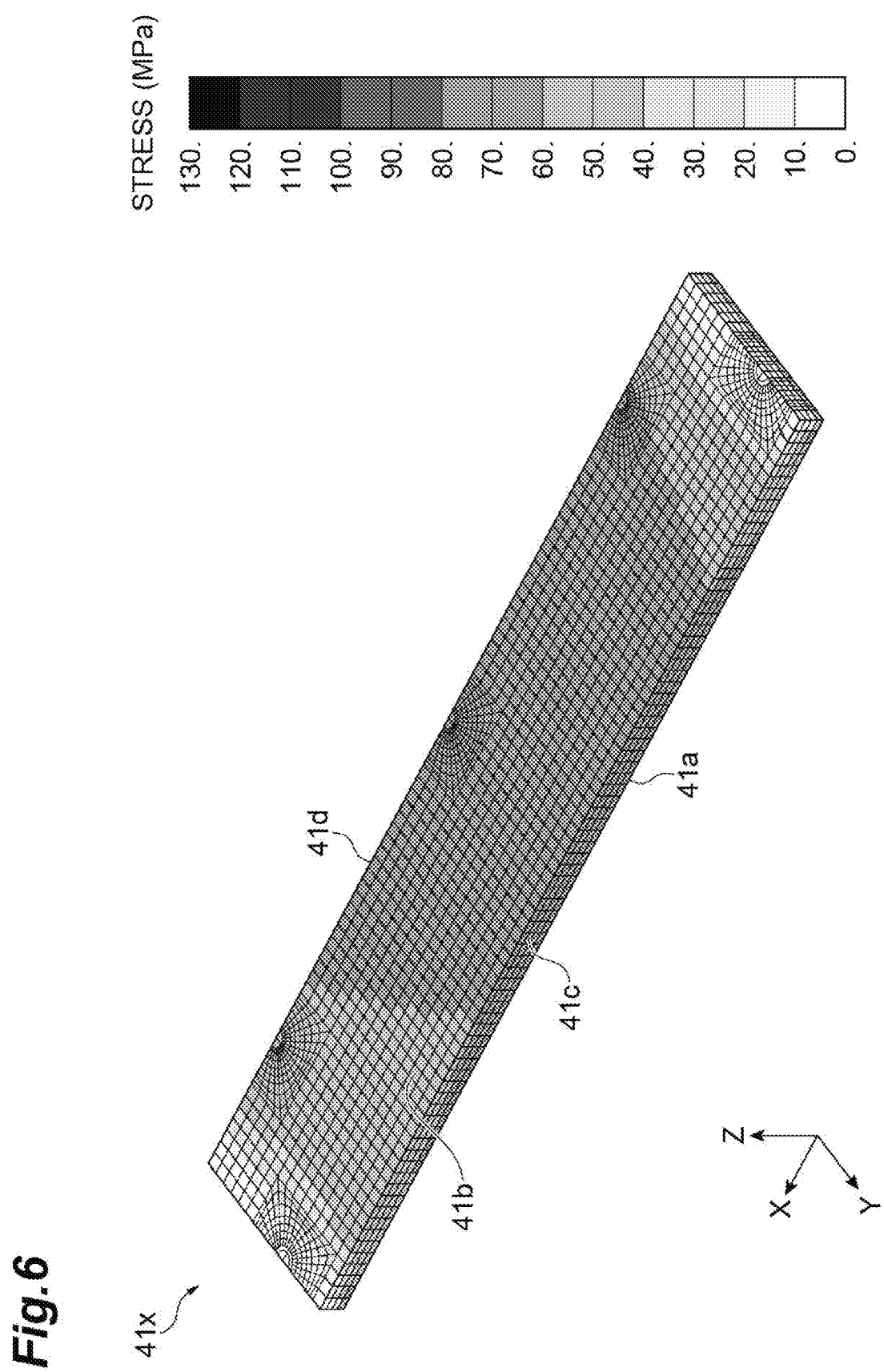

Fig.10A
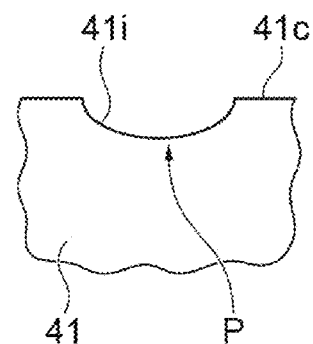
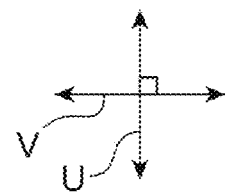

Fig.10C
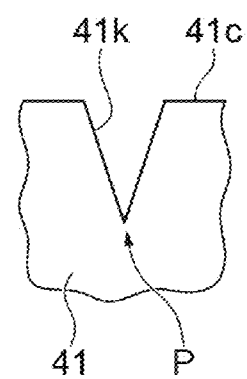
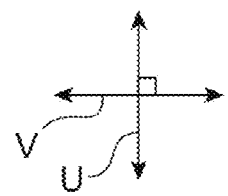

AMPLIFICATION DEVICE AND MATCHING CIRCUIT BOARD

TECHNICAL FIELD

The present disclosure relates to an amplification device and a matching circuit board.

This application is based upon and claims the benefit of priority from Japanese Patent Application No. 2020-060465, filed on Mar. 30, 2020, the entire contents of which are incorporated herein by reference.

BACKGROUND ART

As a radio frequency amplification device, for example, Patent Literature 1 discloses a technology relating to an internal matching type high-output field-effect transistor. The internal matching type high-output field-effect transistor includes a package, an amplification element which amplifies a radio frequency (RF) signal on the package, an input-side matching circuit which is connected between an input end of the amplification element and an input terminal of the package and performs impedance conversion, and an output-side matching circuit which is connected between an output end of the amplification element and an output terminal of the package and performs impedance conversion.

CITATION LIST

Patent Literature

[Patent Literature 1] Japanese Unexamined Patent Publication No. S63-86904

SUMMARY OF INVENTION

One aspect of the present disclosure relates to an amplification device. This amplification device includes a base substrate, an amplification element, and a matching circuit board. The amplification element is mounted on the base substrate. The matching circuit board is mounted on the base substrate and includes a circuit pattern which is electrically connected to the amplification element. The matching circuit board includes a first side surface and a second side surface each extending in a longitudinal direction of the matching circuit board. A first recess is provided in the first side surface. A second recess facing the first recess is provided in the second side surface.

Another aspect of the present disclosure relates to a matching circuit board. This matching circuit board can be mounted on the base substrate and includes a circuit pattern to perform impedance conversion. The matching circuit board includes a first side surface and a second side surface each extending in a longitudinal direction of the matching circuit board. A first recess is provided in the first side surface. A second recess facing the first recess is provided in the second side surface.

BRIEF DESCRIPTION OF DRAWINGS

FIG. 6 is a diagram showing a stress distribution state of a dielectric substrate according to the comparative example.

FIG. 10A is a diagram showing a recess according to the modified example.

FIG. 10C is a diagram showing a recess according to the modified example.

DESCRIPTION OF EMBODIMENTS

Figure 1:
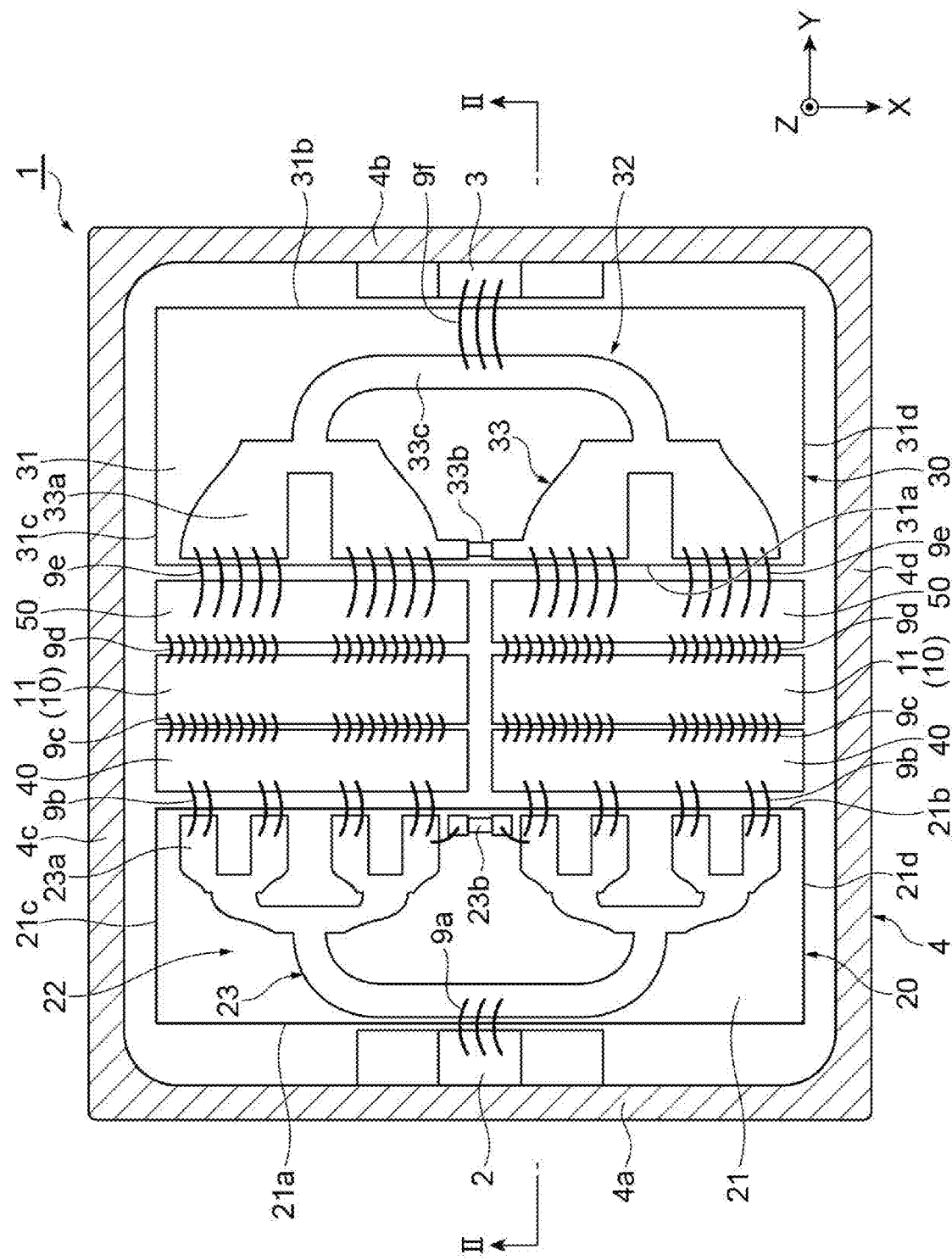
FIG. 1 is a plan view showing an internal configuration of a radio frequency amplification device according to an embodiment.

Problems to be Solved by the Present Disclosure

A matching circuit board for forming the input-side matching circuit or the output-side matching circuit described in Patent Literature 1 is mainly used for forming a capacitive circuit in the impedance conversion. Thus, a thickness of the matching circuit board may be defined from the viewpoint of obtaining a desired capacitance. Further, the thickness of the matching circuit board may be restricted by dimensions of other electronic components mounted in a package shared by the matching circuit board (a thickness of a board different from the matching circuit board, a height of a cavity, or the like). In these cases, it is conceivable that a member having a thickness in a relatively thin range (for example, 0.1 mm to 0.5 mm) be used for the matching circuit board.

It is conceivable that the radio frequency amplification devices on the market will be used in a wide range of temperature conditions (for example, −65° C. to 150° C.). When a temperature change occurs in this temperature range, and a coefficient of linear expansion of a material which constitutes the package on which the matching circuit board is mounted is different from a coefficient of linear expansion of a material which constitutes the matching circuit board, the matching circuit board may be affected by tensile stress, compressive stress, and the like. As described above, since the matching circuit board includes a relatively thin thickness, it is conceivable that cracks and the like will occur in an unspecified manner on the matching circuit board due to the influence of these stresses. In such a case, a circuit function of the matching circuit board may be impaired according to a location at which cracks occur.

However, when countermeasures are taken by adopting a configuration (for example, the thickness of the matching circuit board, an outer size of the matching circuit board, a mounting position of the matching circuit board on the package, a type of a base material of the package, and the like) which avoids the occurrence of cracks in the matching circuit board, countermeasures such as a test are required every time the configuration is changed, and this takes a lot of work.

Effects of the Present Disclosure

According to the present disclosure, a degree of loss of the circuit function of the matching circuit board can be reduced.

Explanation of Embodiments of the Present Disclosure

First, the details of embodiments of the present disclosure will be listed and described. An amplification device according to one embodiment includes a base substrate, an amplification element, and a matching circuit board. The amplification element is mounted on the base substrate. The matching circuit board is mounted on the base substrate and includes a circuit pattern which is electrically connected to the amplification element. The matching circuit board includes a first side surface and a second side surface each extending in a longitudinal direction of the matching circuit board. A first recess is provided in the first side surface. A second recess facing the first recess is provided in the second side surface.

In this amplification device, the first recess and the second recess facing each other are provided in the first side surface and the second side surface of the matching circuit board, respectively. When stress which can cause cracks occurs in such a matching circuit board, the first recess or the second recess preferentially becomes a starting point of a crack. Further, cracks are likely to occur along a line which connects the first recess and the second recess. Thus, it is possible to control a location at which cracks occur in the matching circuit board by the first recess and the second recess. Therefore, even when cracks occur in the matching circuit board, the degree of loss of the circuit function of the matching circuit board can be reduced by providing the first recess and the second recess so that the line which connects the first recess and the second recess is located at a position at which the degree of loss of the circuit function can be reduced (for example, a position at which the matching circuit does not become electrically disconnected). According to such a configuration, even when the coefficient of linear expansion of the material which constitutes the base substrate and the coefficient of linear expansion of the material of the matching circuit board are different from each other, it is possible to reduce the degree of loss of the circuit function of the matching circuit board by a temperature change.

In the amplification device according to one embodiment, a tip end of the first recess and a tip end of the second recess may be located on the same straight line which extends in a direction orthogonal to the longitudinal direction. In this case, the positional relationship between the first recess and the second recess has the shortest distance.

In the amplification device according to one embodiment, the first recess and the second recess may be provided substantially at a center of the matching circuit board in the longitudinal direction.

In the amplification device according to one embodiment, the line which connects the first recess and the second recess may be separate from a circuit pattern. In this case, even when cracks occur in the matching circuit board, the circuit pattern is prevented from becoming cracked. Therefore, it is possible to reduce the degree of loss of the circuit function in the circuit pattern, and the circuit function can be maintained.

In the amplification device according to one embodiment, the matching circuit board may further include a resistance pattern. The line which connects the first recess and the second recess may be separate from the resistance pattern. In this case, even when cracks occur in the matching circuit board, the resistance pattern is prevented from becoming cracked. Therefore, it is possible to reduce a degree of loss of a function obtained by the resistance pattern, and the function obtained by the resistance pattern can be maintained.

In the amplification device according to one embodiment, the matching circuit board may include a dielectric substrate on which a circuit pattern is provided. The first recess and the second recess may be provided on the dielectric substrate. The material constituting the base substrate may include a copper alloy. The dielectric substrate may contain barium titanate. Since a dielectric substrate including barium titanate ($BaTiO_3$) is a plastic material, it is considered that cracks are likely to occur in such a dielectric substrate when a tensile stress is generated in the dielectric substrate. A coefficient of linear expansion of copper (Cu) is about $16.7 \times 10^{-6}$/K, and a coefficient of linear expansion of barium titanate is about $9.6 \times 10^{-6}$/K. In this case, since the coefficient of linear expansion of the material constituting the base substrate is larger than the coefficient of linear expansion of the material constituting the dielectric substrate, when the temperature rises (for example, when temperature changes from 25° C. to 150° C.), an amount of thermal expansion of the base substrate becomes larger than an amount of thermal expansion of the dielectric substrate. Thus, tensile stress is generated on the dielectric substrate, and cracks are likely to occur. On the other hand, according to such an amplification device, since the location at which cracks occur in the dielectric substrate can be controlled by the first recess and the second recess, even when cracks occur, it is possible to prevent loss of the circuit function of the matching circuit board. Therefore, the amplification device according to the present disclosure is advantageous in such a configuration in which cracks are likely to occur in the dielectric substrate.

In the amplification device according to one embodiment, a thickness of the base substrate may be 1 mm or more and 3 mm or less, and a thickness of the dielectric substrate may be 0.1 mm or more and 0.5 mm or less. In this case, since the thickness of the dielectric substrate is relatively thin, cracks are likely to occur in the dielectric substrate due to the matching circuit board being affected by the temperature change. On the other hand, according to the radio frequency amplification device, since the location at which cracks occur in the dielectric substrate can be controlled by the first recess and the second recess, even when cracks occur, it is possible to prevent loss of the circuit function of the matching circuit board. Therefore, the amplification device according to the present disclosure is advantageous in such a configuration in which cracks are likely to occur in the dielectric substrate.

The matching circuit board according to one embodiment can be mounted on the base substrate and be provided with a circuit pattern to perform impedance conversion. The matching circuit board may include a pair of side surfaces each extending in the longitudinal direction of the matching circuit board. In each of the side surfaces, the first recess and the second recess are provided at positions at which they face each other. According to the matching circuit board, similarly to the above, the first recess or the second recess preferentially becomes the starting point of a crack, and a crack is likely to occur along the line which connects the first recess and the second recess. Thus, it is possible to control the location at which cracks occur in the matching circuit board by the first recess and the second recess and to reduce the degree of loss of circuit function.

In the matching circuit board according to one embodiment, a tip end of the first recess and a tip end of the second recess may be located on the same straight line which extends in a direction orthogonal to the longitudinal direction. In this case, the positional relationship between the first recess and the second recess has the shortest distance.

In the matching circuit board according to one embodiment, the first recess and the second recess may be provided substantially at a center of the matching circuit board in the longitudinal direction.

In the matching circuit board according to one embodiment, the line which connects the first recess and the second recess may be separated from the circuit pattern.

In the matching circuit board according to one embodiment, the matching circuit board may further include a resistance pattern. The line which connects the first recess and the second recess may be separated from the resistance pattern.

In the matching circuit board according to one embodiment, the matching circuit board may further include a dielectric substrate on which a circuit pattern is provided. The first recess and the second recess may be provided on the dielectric substrate. The dielectric substrate may include barium titanate.

In the matching circuit board according to one embodiment, a thickness of the dielectric substrate may be 0.1 mm or more and 0.5 mm or less.

Details of Embodiments of the Present Disclosure

Specific examples of the radio frequency amplification device according to one embodiment of the present disclosure will be described below with reference to the drawings. The present disclosure is not limited to this example, but is indicated by the scope of claims and is intended to include all modifications within the meaning and scope of the claims. In the following description, the same elements or elements having the same function will be designated by the same reference numerals, and duplicate description will be omitted. In the description, an XYZ Cartesian coordinate system shown in the drawings may be referred to.

Figure 2:
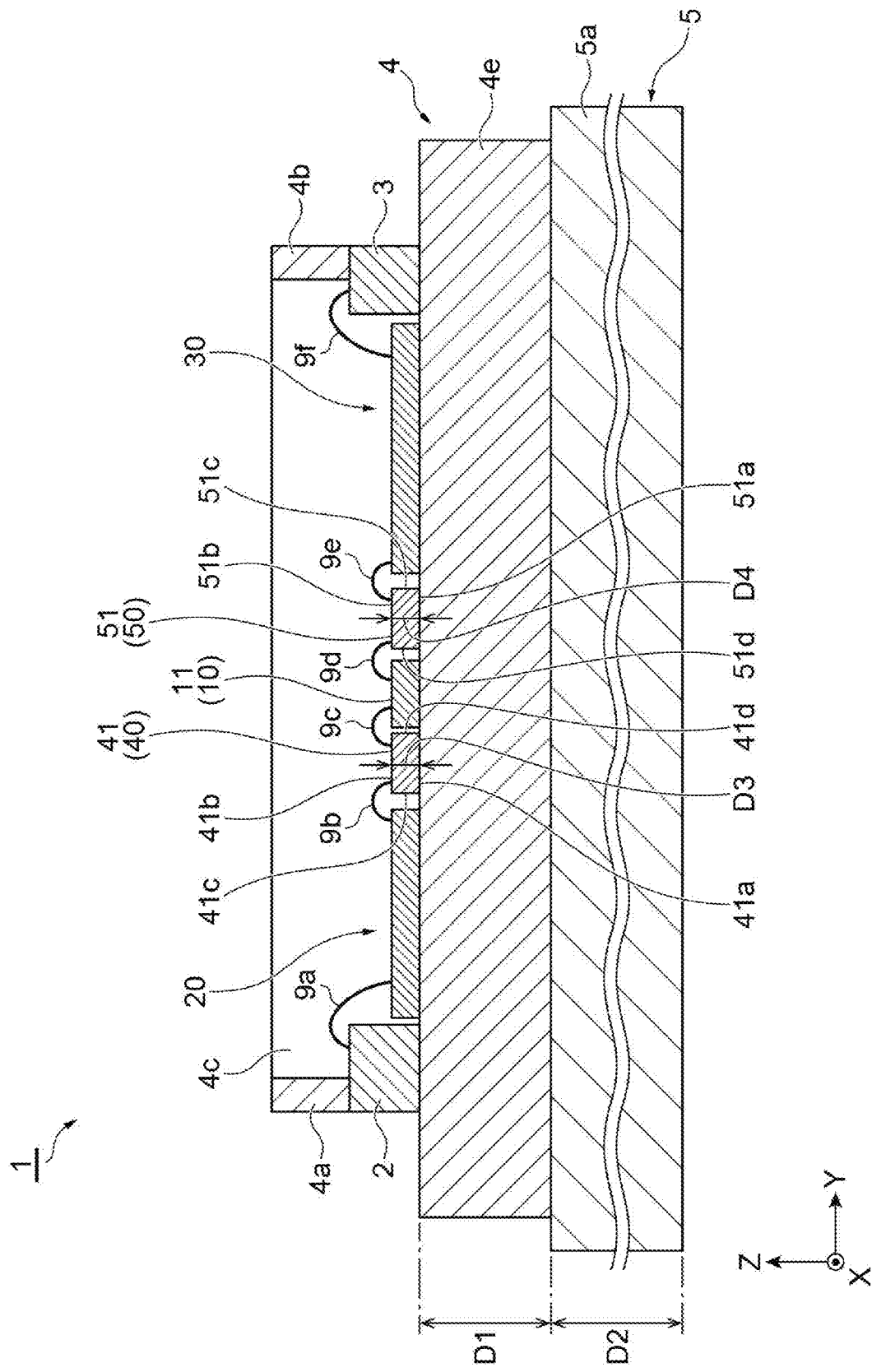
FIG. 2 is a cross-sectional view of the radio frequency amplification device along line II-II of FIG. 1.

FIG. 1 is a plan view showing an internal configuration of a radio frequency amplification device 1 according to one embodiment of the present disclosure. FIG. 2 is a cross-sectional view of the radio frequency amplification device 1 along line II-II of FIG. 1. As shown in FIG. 1, the radio frequency amplification device 1 includes an input terminal 2, an output terminal 3, an amplification element part 10, a branch circuit board 20, a synthesis circuit board 30, a matching circuit 40, and a matching circuit 50. In the present embodiment, the radio frequency amplification device 1 includes two matching circuits 40 and two matching circuits 50 as an example. Further, the amplification element part 10 includes two amplification elements 11. An output per amplification element 11 may be, for example, 30 W, and the output of the entire amplification element part 10 is, for example, 60 W. The radio frequency amplification device 1 includes a package 4 which accommodates the amplification element part 10, the branch circuit board 20, the synthesis circuit board 30, and the matching circuits 40 and 50, and a housing 5 which accommodates the package 4.

The package 4 is made of a metal material and is connected to a reference potential. An example of the metal material constituting the package 4 is a copper (Cu) alloy. A coefficient of linear expansion of the Cu alloy is, for example, about $16.7 \times 10^{-6}$/K. A planar shape of the package 4 is substantially rectangular. The package 4 includes end walls 4a and 4b which face each other in a first direction, and side walls 4c and 4d which face each other in a second direction. The first direction and the second direction intersect each other, and in one example, they are orthogonal to each other. In the present embodiment, the first direction is a Y-axis direction and the second direction is an X-axis direction.

The package 4 includes a rectangular flat bottom plate 4e (a base substrate). The bottom plate 4e extends along a plane defined by the Y-axis direction and the X-axis direction. A thickness D1 of the bottom plate 4e (here, a length in a Z-axis direction) is, for example, 1 mm or more and 3 mm or less. The end walls 4a and 4b stand upright along a pair of sides (sides extending in the X-axis direction) of the bottom plate 4e, and the side walls 4c and 4d stand upright along another pair of sides (sides extending in the Y-axis direction) of the bottom plate 4e. The package 4 further includes a lid part (not shown). The lid part seals an upper opening defined by the end walls 4a and 4b and the side walls 4c and 4d.

The housing 5 is made of a metal material. A coefficient of linear expansion of the metal material constituting the housing 5 is larger than, for example, the coefficient of linear expansion of the metal material constituting the package 4. An example of the metal material constituting the housing 5 is aluminum (Al). The coefficient of linear expansion of Al is, for example, about $23.7 \times 10^{-6}$/K. A planar shape of the housing 5 is substantially rectangular. The housing 5 includes a rectangular flat bottom plate 5a. The package 4 is disposed on the bottom plate 5a. The bottom plate 5a extends along a plane defined by the Y-axis direction and the X-axis direction. A thickness D2 of the bottom plate 5a (here, a length in the Z-axis direction) is larger than, for example, the thickness D1. The thickness D2 is, for example, 5 mm or more and 20 mm or less. The housing 5 may further include side walls (not shown) which extend along respective sides of the bottom plate and a lid part (not shown).

The input terminal 2 is a metal wiring pattern, and inputs a radio frequency signal from the outside of the radio frequency amplification device 1. The radio frequency signal is a signal based on a multi-carrier transmission method, and is formed by superimposing a plurality of signals having different carrier signal frequencies. A frequency band of the carrier signal is, for example, 500 MHz or less. The input terminal 2 is provided at a center portion of the end wall 4a in the X-axis direction, and extends from the outside to the inside of the package 4.

The amplification element part 10 is disposed at a substantially center portion of the package 4 in the Y-axis direction which is on the bottom plate 4e of the package 4. Each of the amplification elements 11 of the amplification element part 10 includes a built-in transistor. The transistor is, for example, a field effect transistor (FET), and is a high electron mobility transistor (HEMT) in one example. Each of the amplification elements 11 includes a plurality of gate fingers, a plurality of source fingers, and a plurality of drain fingers. In the Y-axis direction, the source fingers and the drain fingers are alternately arranged, and the gate fingers are disposed between the source fingers and the drain fingers. Gate pads (signal input ends) and source pads are alternately arranged on an end side of each of the amplification elements 11 near the input terminal 2, and drain pads (signal output ends) are arranged on an end side of each of the amplification elements 11 near the output terminal 3. Each of the source pads is electrically connected to the bottom plate 4e of the package 4 via a via hole passing through the amplification element 11 in a thickness direction (here, the Z-axis direction), and is set as a reference potential. Each of the amplification elements 11 amplifies a radio frequency signal input to each of the gate pads, and outputs an amplified radio frequency signal from each of the drain pads.

The branch circuit board 20 is disposed on the bottom plate 4e of the package 4. The branch circuit board 20 is disposed together with the input terminal 2 and the amplification element part 10 in the Y-axis direction, and is located between the input terminal 2 and the amplification element part 10. The branch circuit board 20 includes a ceramic substrate 21 and a branch circuit 22 provided on a main surface of the substrate 21. A planar shape of the substrate 21 is, for example, a rectangle, with one long side 21a facing the input terminal 2, and the other long side 21b facing the amplification element part 10 via the matching circuit 40. A back surface of the substrate 21 faces the bottom plate 4e of the package 4. One short side 21c of the substrate 21 is located near the side wall 4c of the package 4, and the other short side 21d of the substrate 21 is located near the side wall 4d of the package 4. That is, the substrate 21 extends from the vicinity of one end of the package 4 to the vicinity of the other end thereof in the X-axis direction.

The branch circuit 22 includes a wiring pattern 23 provided on the main surface of the substrate 21. The wiring pattern 23 is electrically connected to the input terminal 2 via a bonding wire 9a. The radio frequency signal is input to the wiring pattern 23 from the center portion of the substrate 21 in the X-axis direction. The wiring pattern 23 has a shape which is line-symmetrical with respect to a center line of the substrate 21 in the Y-axis direction. The wiring pattern 23 repeats bifurcation starting from a connection point with the bonding wire 9a, and finally reaches eight metal pads 23a. The eight metal pads 23a are arranged along the long side 21b. The metal pads 23a adjacent to each other are connected to each other via a film resistor to constitute a Wilkinson type coupler. Thus, while isolation between the plurality of gate pads of the amplification element part 10 is ensured, matching of an input impedance of the amplification element part 10 as seen from the input terminal 2 is promoted. In the drawing, only one film resistor 23b is shown as a representative. The eight metal pads 23a are electrically connected to the matching circuit 40 via the bonding wires 9b.

Figure 3A:
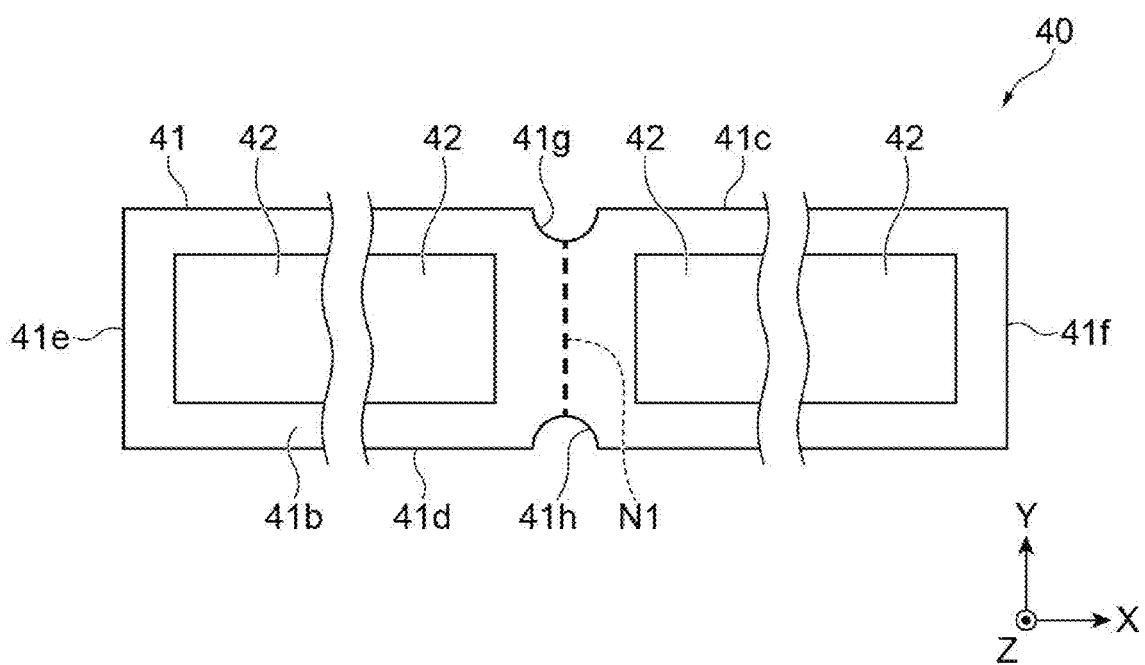
FIG. 3A is a plan view showing a matching circuit on the input side shown in FIG. 1.

The matching circuit 40 (the matching circuit board) is disposed on the bottom plate 4e of the package 4 and is disposed between the branch circuit board 20 and the amplification element part 10 in the Y-axis direction. Two matching circuits 40 are arranged in the X-axis direction between the branch circuit board 20 and the amplification element part 10. FIG. 3A is a plan view showing the matching circuit 40 of FIG. 1. The matching circuit 40 is, for example, a die capacitor. As shown in FIG. 3A, the matching circuit 40 includes a dielectric substrate 41 and a plurality of metal pads 42.

The dielectric substrate 41 is, for example, a plastic body. A coefficient of linear expansion of the dielectric material constituting the dielectric substrate 41 is smaller than, for example, the coefficient of linear expansion of the metal material constituting the package 4. Examples of the dielectric material constituting the dielectric substrate 41 include those containing barium (Ba) and titanium (Ti). As an example, the dielectric material constituting the dielectric substrate 41 is barium titanate ($BaTiO_3$). A coefficient of linear expansion of barium titanate is, for example, about $9.6 \times 10^{-6}$/K. A planar shape of the dielectric substrate 41 is substantially rectangular. The dielectric substrate 41 extends along a plane defined by the Y-axis direction and the X-axis direction. A thickness D3 (here, a length in the Z-axis direction) of the dielectric substrate 41 is, for example, 0.1 mm or more and 0.5 mm or less. The dielectric substrate 41 includes a main surface 41a (a first main surface) fixed to the bottom plate 4e, a main surface 41b (a second main surface) opposite to the main surface 41a, side surfaces 41c and 41d connected to the main surfaces 41a and 41b, and end surfaces 41e and 41f (also refer to FIG. 2). The main surface 41a faces the bottom plate 4e. The side surface 41c (a first side surface) and the side surface 41d (a second side surface) extend in a direction along each other (here, the X-axis direction). The end surface 41e and the end surface 41f extend in a direction along each other (here, the Y-axis direction). The side surfaces 41c and 41d are long sides of the dielectric substrate 41, and the end surfaces 41e and 41f are short sides of the dielectric substrate 41. In this example, a longitudinal direction of the dielectric substrate 41 and the matching circuit 40 (the matching circuit board) is the X-axis direction. A transverse direction of the dielectric substrate 41 and the matching circuit 40 (the matching circuit board) is the Y-axis direction.

A recess 41g (a first recess) recessed toward the side surface 41d is provided in the side surface 41c, and a recess 41h (a second recess) recessed toward the side surface 41c is provided in the side surface 41d. The recesses 41g and 41h are provided at positions at which they face each other. In other words, the recesses 41g and 41h facing each other are provided in the pair of long sides of the dielectric substrate 41, respectively. Specifically, the recesses 41g and 41h face each other in a direction in which cracks are desired to occur in the dielectric substrate 41. In the present embodiment, as an example, the recesses 41g and 41h face each other in a direction (here, the Y-axis direction) orthogonal to an extension direction of the side surfaces 41c and 41d. The recesses 41g and 41h may face each other in a direction inclined with respect to the extension direction of the side surfaces 41c and 41d. As an example, the positions at which the recesses 41g and 41h are provided are substantially center portions of the dielectric substrate 41 and the matching circuit 40 (the matching circuit substrate) in the X-axis direction. The substantially center portion refers to, for example, a position within ±5% of a length in the X-axis direction from a center of the length in the X-axis direction. A planar shape of each of the recesses 41g and 41h is, for example, a semicircular shape. In this example, a tip end of the recess 41g and a tip end of the recess 41h are located on the same straight line which extends in the Y-axis direction orthogonal to the X-axis direction.

The metal pad 42 is an example of the circuit pattern in the present embodiment. The metal pads 42 are, for example, gold (Au) plated. Each of the metal pads 42 is provided on the main surface 41b of the dielectric substrate 41. On the main surface 41b, a line N1 which connects the above-described recesses 41g and 41h is separated from the metal pads 42. That is, the line N1 does not intersect the metal pads 42. In this example, the line N1 extends in the Y-axis direction. The number of metal pads 42 is, for example, the same as the number of metal pads 23a (8 in this case) in the two matching circuits 40, and is evenly distributed in each of the matching circuits 40. The plurality of metal pads 42 are arranged in a row in the X-axis direction. Each of the metal pads 42 is electrically connected to the corresponding metal pad 23a via the bonding wires 9b and is electrically connected to the corresponding gate pad(s) of the amplification element part 10 via a bonding wires 9c.

In the matching circuit 40, a T-type filter circuit (a matching circuit) is configured of inductance components of the bonding wires 9b and 9c and capacitance of the metal pad 42 connected between a node between the inductance components and a reference potential (the bottom plate 4e). The matching circuit 40 achieves impedance matching with respect to the amplification element part 10 by performing impedance conversion with the T-type filter circuit. Normally, the impedance with which the inside of the transistor is able to be estimated from the gate pad in the amplification element part 10 is different from the characteristic impedance of a transmission line (for example, 50Ω). The matching circuit 40 converts this impedance to 50Ω in which the inside of the package 4 is estimated from the input terminal 2 by the T-type filter circuit.

Figure 3B:
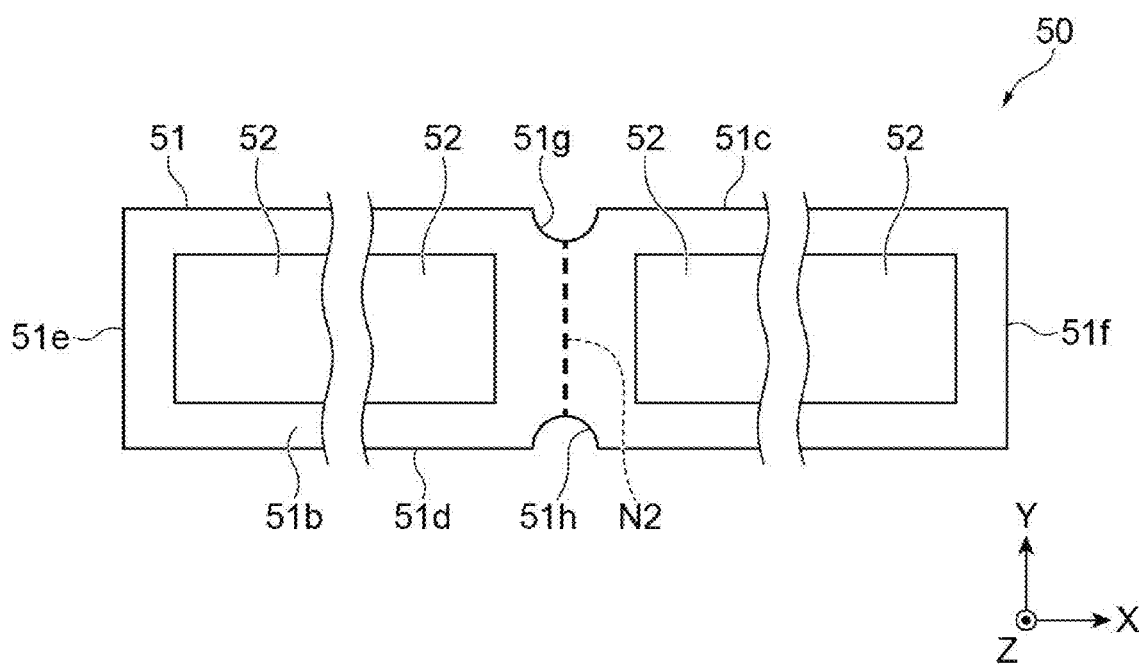
FIG. 3B is a plan view showing a matching circuit on the output side shown in FIG. 1.

The matching circuit 50 (the matching circuit board) is disposed on the bottom plate 4e of the package 4 and is disposed between the amplification element part 10 and the synthesis circuit board 30 in the Y-axis direction. Two matching circuits 50 are arranged in the X-axis direction between the amplification element part 10 and the synthesis circuit board 30. FIG. 3B is a plan view showing the matching circuit 50 of FIG. 1. The matching circuit 50 is, for example, a parallel plate type capacitor (the die capacitor) like the matching circuit 40. As shown in FIG. 3B, the matching circuit 50 includes a dielectric substrate 51 and a plurality of metal pads 52.

The dielectric substrate 51 is, for example, a plastic body. A coefficient of linear expansion of a dielectric material constituting the dielectric substrate 51 is, for example, the same as the coefficient of linear expansion of the dielectric material constituting the dielectric substrate 41, and is smaller than the coefficient of linear expansion of the metal material constituting the package 4. The dielectric material constituting the dielectric substrate 51 is, for example, the same as the dielectric material constituting the dielectric substrate 41. A planar shape of the dielectric substrate 51 is substantially rectangular. The dielectric substrate 51 extends along a plane defined by the Y-axis direction and the X-axis direction. A thickness D4 (here, a length in the Z-axis direction) of the dielectric substrate 51 is, for example, 0.1 mm or more and 0.5 mm or less. The dielectric substrate 51 includes a main surface 51a (a first main surface) fixed to the bottom plate 4e, a main surface 51b opposite to the main surface 51a, side surfaces 51c and 51d connected to the main surfaces 51a and 51b, and end surfaces 51e and 51f (also refer to FIG. 2). The main surface 51a faces the bottom plate 4e. The side surface 51c (a first side surface) and the side surface 51d (a second side surface) extend in a direction along each other (here, the X-axis direction). The end surface 51e and the end surface 51f extend in a direction along each other (here, the Y-axis direction). The side surfaces 51c and 51d are long sides of the dielectric substrate 51, and the end surfaces 51e and 51f are short sides of the dielectric substrate 51. In this example, a longitudinal direction of the dielectric substrate 51 and the matching circuit 50 (the matching circuit board) is the X-axis direction. A transverse direction of the dielectric substrate 51 and the matching circuit 50 (the matching circuit board) is the Y-axis direction.

A recess 51g (a first recess) recessed toward the side surface 51d is provided in the side surface 51c, and a recess 51h (a second recess) recessed toward the side surface 51c is provided in the side surface 51d. The recesses 51g and 51h are provided at positions at which they face each other. In other words, the recesses 51g and 51h facing each other are provided on the pair of long sides of the dielectric substrate 51, respectively. Specifically, the recesses 51g and 51h face each other in a direction in which cracks are desired to occur in the dielectric substrate 51. In the present embodiment, as an example, the recesses 51g and 51h face each other in a direction (here, the Y-axis direction) orthogonal to an extension direction of the side surfaces 51c and 51d. The recesses 51g and 51h may face each other in a direction inclined with respect to the extension direction of the side surfaces 51c and 51d. As an example, the positions at which the recesses 51g and 51h are provided are substantially center portions of the dielectric substrate 51 and the matching circuit 50 (the matching circuit board) in the X-axis direction. The substantially center portion refers to, for example, a position within ±5% of a length in the X-axis direction from a center of the length in the X-axis direction. A planar shape of the recesses 51g and 51h is, for example, a semicircular shape. The dielectric substrate 51 may be configured in the same manner as the dielectric substrate 41. In this example, a tip end of the recess 51g and a tip end of the recess 51h are located on the same straight line which extends in the Y-axis direction orthogonal to the X-axis direction.

The metal pad 52 is an example of the circuit pattern in the present embodiment. Each of metal pads 52 is provided on the main surface 51b of the dielectric substrate 51. On the main surface 51b, a line N2 which connects the above-described recesses 51g and 51h is separated from the metal pads 52. That is, the line N2 is not in contact with the metal pads 52. In this example, the line N2 extends in the Y-axis direction. The number of metal pads 52 is, for example, the same as the number of metal pads 23a (8 in this case) in the two matching circuits 50, and is evenly distributed in each of the matching circuits 50. The plurality of metal pads 52 are arranged in a row in the X-axis direction. Each of the metal pads 52 is electrically connected to the corresponding drain pad of the amplification element part 10 via bonding wires 9d, and is electrically connected to a corresponding metal pad 33a (described later) of the synthesis circuit board 30 via a bonding wire 9e.

Also in the matching circuit 50, a T-type filter circuit (a matching circuit) is configured of inductance components of the bonding wires 9d and 9e and capacitance of the metal pad 52 connected between a node between the inductance components and a reference potential (the bottom plate 4e). The matching circuit 50 achieves impedance matching with respect to the amplification element part 10 by performing impedance conversion with the T-type filter circuit. Normally, the impedance with which the inside of the transistor is able to be estimated from the drain pad in the amplification element part 10 is different from the characteristic impedance of the transmission line (for example, 50Ω), and is generally smaller than 50Ω. The matching circuit 50 matches this impedance with 50Ω in which the inside of the package 4 is estimated from the output terminal 3 by the T-type filter circuit.

The synthesis circuit board 30 is disposed on the bottom plate 4e of the package 4. The synthesis circuit board 30 is disposed together with the amplification element part 10 and the output terminal 3 in the Y-axis direction, and is located between the amplification element part 10 and the output terminal 3. The synthesis circuit board 30 includes a ceramic substrate 31 and a synthesis circuit 32 provided on the main surface of the substrate 31. A planar shape of the substrate 31 is, for example, rectangular, one long side 31a faces the amplification element part 10 via the matching circuit 50, and the other long side 31b faces the output terminal 3. A back surface of the substrate 31 faces the bottom plate 4e of the package 4. One short side 31c of the substrate 31 is located near the side wall 4c of the package 4, and the other short side 31d of the substrate 31 is located near the side wall 4d of the package 4. That is, the substrate 31 extends from the vicinity of one end to the vicinity of the other end of the package 4 in the X-axis direction.

The synthesis circuit 32 synthesizes signals output from the plurality of drain pads of the amplification element part 10 into one output signal. The synthesis circuit 32 includes a wiring pattern 33 provided on the main surface of the substrate 31. The wiring pattern 33 has a shape which is line-symmetrical with respect to a center line of the substrate 31 in the Y-axis direction. The wiring pattern 33 includes four metal pads 33a. The four metal pads 33a are arranged along the long side 31a. The metal pads 33a adjacent to each other are connected to each other via a film resistor to form a Wilkinson type coupler. Thus, while isolation between the plurality of drain pads of the amplification element part 10 is ensured, matching of output impedance of the amplification element part 10 as seen from the output terminal 3 is promoted. In the drawing, only one film resistor 33b is shown as a representative. Each of the metal pads 33a is electrically connected to two corresponding metal pads 52 of the matching circuit 50 via the bonding wires 9e. The wiring pattern 33 finally reaches a connection point with the bonding wire 9f while coupling from the four metal pads 33a is repeated. The wiring pattern 33 is electrically connected to the output terminal 3 via the bonding wires 9f. An amplified radio frequency signal is output to the output terminal 3 from the center portion of the substrate 31 in the X-axis direction.

The output terminal 3 is a metal wiring pattern, and outputs the amplified radio frequency signal to the outside of the radio frequency amplification device 1. The output terminal 3 is provided at a center portion of the end wall 4b in the X-axis direction, and extends from the inside to the outside of the package 4.

Figure 4:
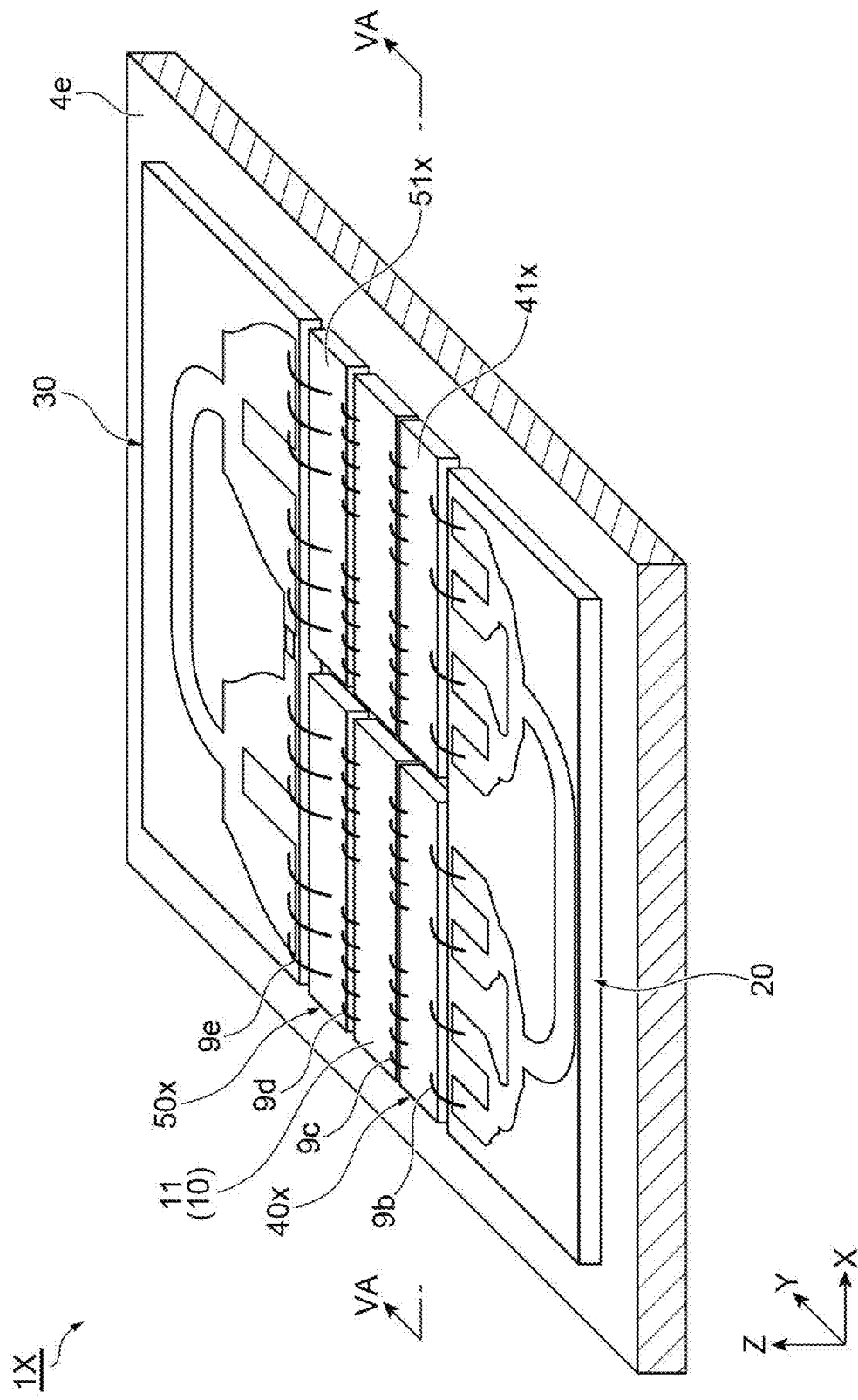
FIG. 4 is a perspective view showing a part of a radio frequency amplification device according to a comparative example.
Figure 5A:
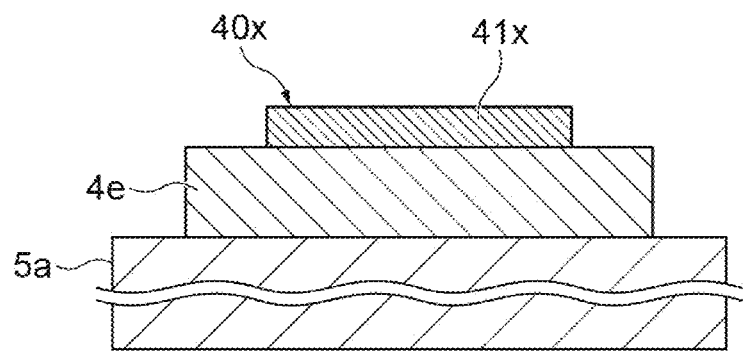
FIG. 5A is a cross-sectional view of the radio frequency amplification device along line VA-VA of FIG. 4.

Effects of the above-described radio frequency amplification device 1 will be described. First, a comparative example will be described. FIG. 4 is a perspective view showing a part of a radio frequency amplification device 1X according to the comparative example. FIG. 5A is a cross-sectional view of the radio frequency amplification device 1X along VA-VA line of FIG. 4. The radio frequency amplification device 1X is different from the radio frequency amplification device 1 in that a matching circuit 40X is provided in place of the matching circuit 40 and a matching circuit 50X is provided in place of the matching circuit 50. Other configurations of the radio frequency amplification device 1X are the same as those of the radio frequency amplification device 1, and are shown schematically in the drawing.

The matching circuit 40X is different from the matching circuit 40 in that a dielectric substrate 41X is provided in place of the dielectric substrate 41, and is similar to the matching circuit 40 in other configurations. The dielectric substrate 41X is different from the dielectric substrate 41 in that the recesses 41g and 41h are not provided. Other configurations of the dielectric substrate 41X are the same as those of the dielectric substrate 41.

Figure 5B:
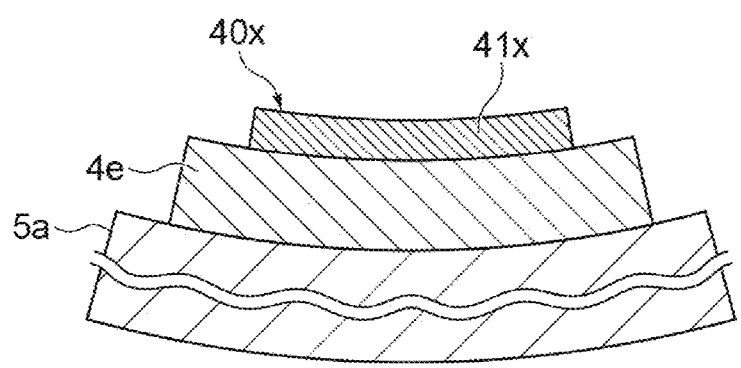
FIG. 5B is a diagram for explaining a state in which a matching circuit of FIG. 5A is affected by a temperature change.

The radio frequency amplification device 1X having such a configuration may be used in a wide range of temperature conditions (for example, −65° C. or higher and 150° C. or lower). When a temperature change occurs in this temperature range, since the coefficient of linear expansion of the material constituting the package 4 and the coefficient of linear expansion of the material constituting the dielectric substrate 41X of the matching circuit 40X are different each other, the dielectric substrate 41X is subject to stress such as tensile stress or compressive stress. FIG. 5B is a diagram for explaining a state in which the matching circuit 40 of FIG. 5A is affected by the temperature change. FIG. 5B shows a case in which the radio frequency amplification device 1X which was in the state shown in FIG. 5A under a temperature environment of room temperature (for example, 25° C.) is placed in a temperature environment of a higher temperature (for example, 150° C.).

In the radio frequency amplification device 1X, similarly to the radio frequency amplification device 1, the material constituting the package 4 contains a Cu alloy, and the dielectric substrate 41X contains Ba and Ti. For example, the dielectric material constituting the dielectric substrate 41X is barium titanate ($BaTiO_3$). Since the dielectric substrate 41X containing barium titanate is a plastic body, it is considered that cracks are likely to occur in the dielectric substrate 41X when a tensile stress is generated in the dielectric substrate 41X. Further, since the coefficient of linear expansion of the material constituting the package 4 is larger than the coefficient of linear expansion of the material constituting the dielectric substrate 41X, when the temperature rises (that is, a case shown in FIG. 5B), an amount of thermal expansion of the package 4 becomes larger than an amount of thermal expansion of the dielectric substrate 41X. Therefore, expansion of the dielectric substrate 41X cannot follow thermal expansion of the package 4, and tensile stress is generated over almost the entire dielectric substrate 41X. Specifically, as shown in FIG. 5B, stress is generated so that the dielectric substrate 41X warps toward the package 4.

Figure 7:
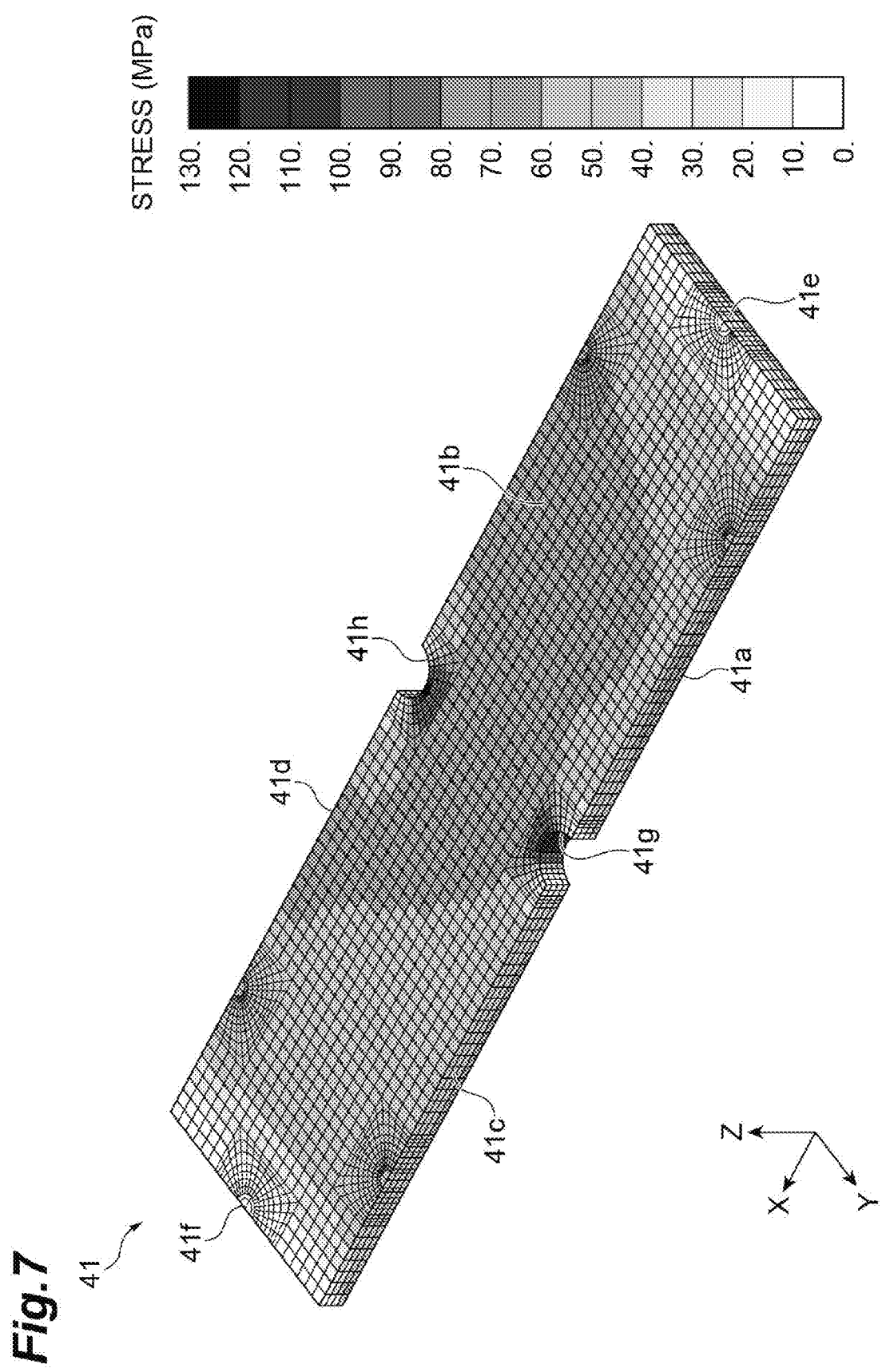
FIG. 7 is a diagram showing a stress distribution state of a dielectric substrate according to the present embodiment.

FIG. 6 is a diagram showing a stress distribution state of the dielectric substrate 41X according to the comparative example. FIG. 7 is a diagram showing a stress distribution state of the dielectric substrate 41 according to the present embodiment. FIGS. 6 and 7 show the stress distribution states (simulation results) of the dielectric substrates 41 and 41X when they are affected by the temperature change from 25° C. to 125° C. In FIGS. 6 and 7, illustration of other members is omitted. In FIGS. 6 and 7, the stress is shown by contour lines, and as the color becomes darker, the stress increases. From FIG. 6, it can be seen that a stress of 70 MPa or more and 80 MPa or less is generated in the dielectric substrate 41X. Further, from FIG. 6, it can be seen that in the dielectric substrate 41X, the stress distribution in a long side direction is gentle, and a large or steep change in the stress does not occur at a specific location. It can be said that cracks C (refer to FIG. 4) are likely to occur at unspecified positions on the dielectric substrate 41X due to a variation in a mounting position of the dielectric substrate 41X on the bottom plate 4e of the package 4.

On the other hand, in the radio frequency amplification device 1, recesses 41g and recesses 41h facing each other are provided in the side surface 41c and the side surface 41d of the dielectric substrate 41 of the matching circuit 40. When a stress which may cause cracks occurs in such a dielectric substrate 41, as shown in FIG. 7, it can be seen that a particularly large stress (a stress of 120 MPa or more and 130 MPa or less in the example of FIG. 7) is generated in the recess 41g and the recess 41h. As described above, since the large stress locally occurs, the recess 41g or the recess 41h preferentially serves as a starting point of the crack. Further, cracks are likely to occur in a direction perpendicular to a stress direction, and are likely to occur along a line N1 which connects the recess 41g and the recess 41h. Therefore, a location which cracks occur in the dielectric substrate 41 can be controlled by the recess 41g and the recess 41h. Therefore, even when cracks occur in the dielectric substrate 41, the degree of loss of the circuit function of the matching circuit 40 can be reduced by providing the recess 41g and the recess 41h so that the line N1 which connects the recess 41g and the recess 41h is located at a position at which the matching circuit 40 is not electrically disconnected. According to such a configuration, even when the coefficient of linear expansion of the material constituting the package 4 and the coefficient of linear expansion of the material constituting the dielectric substrate 41 of the matching circuit 40 are different from each other, it is possible to reduce the degree of loss of the circuit function of the matching circuit 40 by the temperature change. The same applies to the matching circuit 50.

In the radio frequency amplification device 1, the line N1 which connects the recess 41g and the recess 41h is separated from the metal pad 42. With such a configuration, even when cracks occur in the dielectric substrate 41 of the matching circuit 40, cracks are prevented from reaching the metal pad 42. Therefore, it is possible to reduce the degree of loss of the circuit function in the metal pad 42, and the circuit function can be maintained. The same applies to the matching circuit 50.

In the radio frequency amplification device 1, the material constituting the package 4 contains a copper alloy, and the dielectric substrate 41 contains barium titanate. Thus, as described above, cracks are likely to occur when tensile stress is applied to the dielectric substrate 41. On the other hand, according to the radio frequency amplification device 1, since the location at which cracks occur in the dielectric substrate 41 can be controlled by the recess 41g and the recess 41h, even when cracks occur, it is possible to reduce the degree of loss of the circuit function of the matching circuit 40. Therefore, the radio frequency amplification device 1 is advantageous in such a configuration in which cracks are likely to occur in the dielectric substrate 41. The same applies to the matching circuit 50.

In the radio frequency amplification device 1, the thickness D1 of the bottom plate 4e of the package 4 is 1 mm or more and 2 mm or less, and the thickness D3 of the dielectric substrate 41 is 0.1 mm or more and 0.5 mm or less. Since the thickness D3 of the dielectric substrate 41 is relatively thin, cracks are likely to occur in the dielectric substrate 41 due to the influence of the temperature change on the dielectric substrate 41. On the other hand, according to the radio frequency amplification device 1, since the location at which cracks occur in the dielectric substrate 41 can be controlled by the recess 41g and the recess 41h, even when cracks occur, it is possible to reduce the degree of loss of the circuit function of the matching circuit 40. Therefore, the radio frequency amplification device 1 is advantageous in such a configuration in which cracks are likely to occur in the dielectric substrate 41. The same applies to the matching circuit 50.

The above-described embodiment describes one embodiment of the radio frequency amplification device according to the present disclosure. The radio frequency amplification device according to the present disclosure may be an arbitrary modification of each of the above-described embodiment.

For example, the radio frequency amplification device 1 according to the above-described embodiment includes two matching circuits 40 and two matching circuits 50, and the amplification element part 10 includes two amplification elements 11, but the present disclosure is not limited to such a configuration. The radio frequency amplification device 1 may include one matching circuit 40 and one matching circuit 50, or may include three or more matching circuits 40 and three or more matching circuits 50. The amplification element part 10 may include a single amplification element 11, or may include three or more amplification elements 11.

Figure 8:
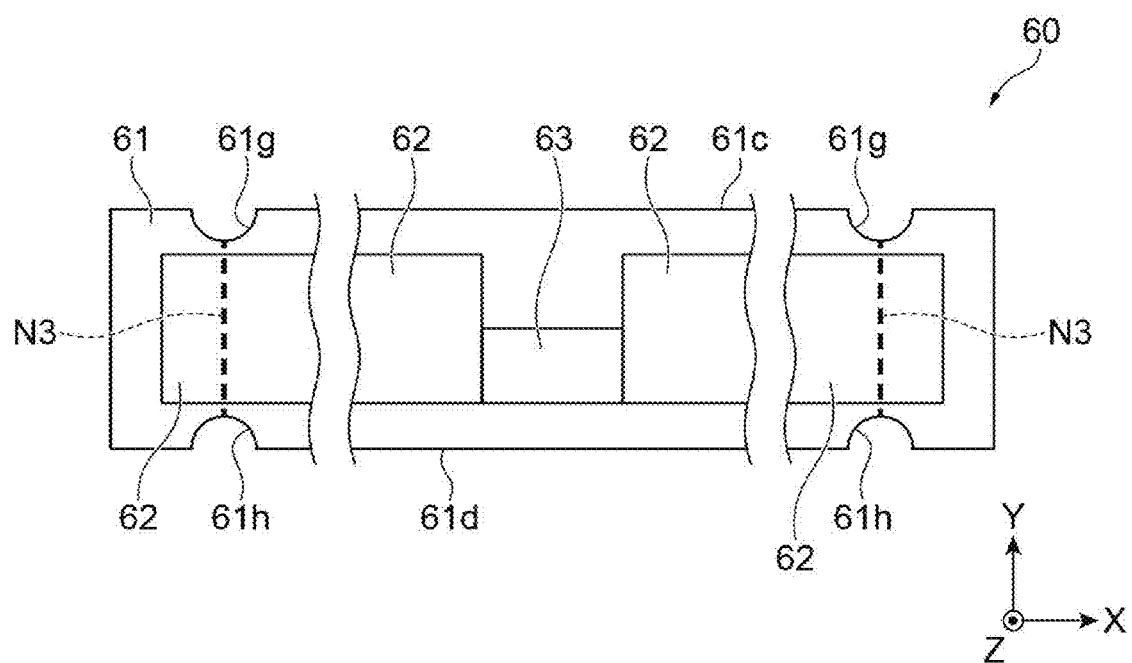
FIG. 8 is a plan view showing a matching circuit according to the modified example.

Further, the radio frequency amplification device 1 may include a matching circuit 60 shown in FIG. 8 instead of the matching circuit 40. FIG. 8 is a plan view showing the matching circuit 60 according to a modified example. The matching circuit 60 is different from the matching circuit 40 in that a dielectric substrate 61 is provided in place of the dielectric substrate 41, a metal pad 62 is provided in place of the metal pad 42, and a resistance film 63 (a resistance pattern) is further provided. Other configurations of the matching circuit 60 are the same as those of the matching circuit 40. The dielectric substrate 61 is different from the dielectric substrate 41 in that it includes side surfaces 61c and 61d instead of the side surfaces 41c and 41d, and is similar to the dielectric substrate 41 in other respects. The side surfaces 61c and 61d are long sides of the dielectric substrate 61 like the side surfaces 41c and 41d. The side surface 61c (a first side surface) and the side surface 61d (a second side surface) extend in a direction along each other (here, the X-axis direction). In this example, a longitudinal direction of the dielectric substrate 61 and the matching circuit 60 (the matching circuit board) is the X-axis direction. A transverse direction of the dielectric substrate 61 and the matching circuit 60 (the matching circuit board) is the Y-axis direction.

Two recesses 61g (first recesses) recessed toward the side surface 61d are provided in the side surface 61c, and two recesses 61h (second recesses) recessed toward the side surface 61c are provided in the side surface 61d. The recesses 61g and 61h are provided at positions at which they face each other. In other words, the recesses 61g and 61h facing each other are provided on the pair of long sides of the dielectric substrate 61, respectively. The positions at which the recesses 61g and 61h are provided are both end portions of the dielectric substrate 41 in the X-axis direction. A planar shape of the recesses 61g and 61h is, for example, a semicircular shape. In this example, a tip end of the recess 61g and a tip end of the recess 61h are located on the same straight line which extends in the Y-axis direction orthogonal to the X-axis direction. The metal pad 62 is different from the metal pad 42 in that it has a thickness (a length in the Z-axis direction) larger than the thickness of the metal pad 42 (the length in the Z-axis direction), and is similar to the metal pad 42 in other configurations. The resistance film 63 is disposed between two metal pads 62 adjacent to each other in the X-axis direction, and is electrically connected to the two metal pads 62. A line N3 which connects the above-described recesses 61g and 61h is separated from the resistance film 63. That is, the line N3 does not intersect the resistance film 63. In this example, the line N1 extends in the Y-axis direction.

Figure 9:
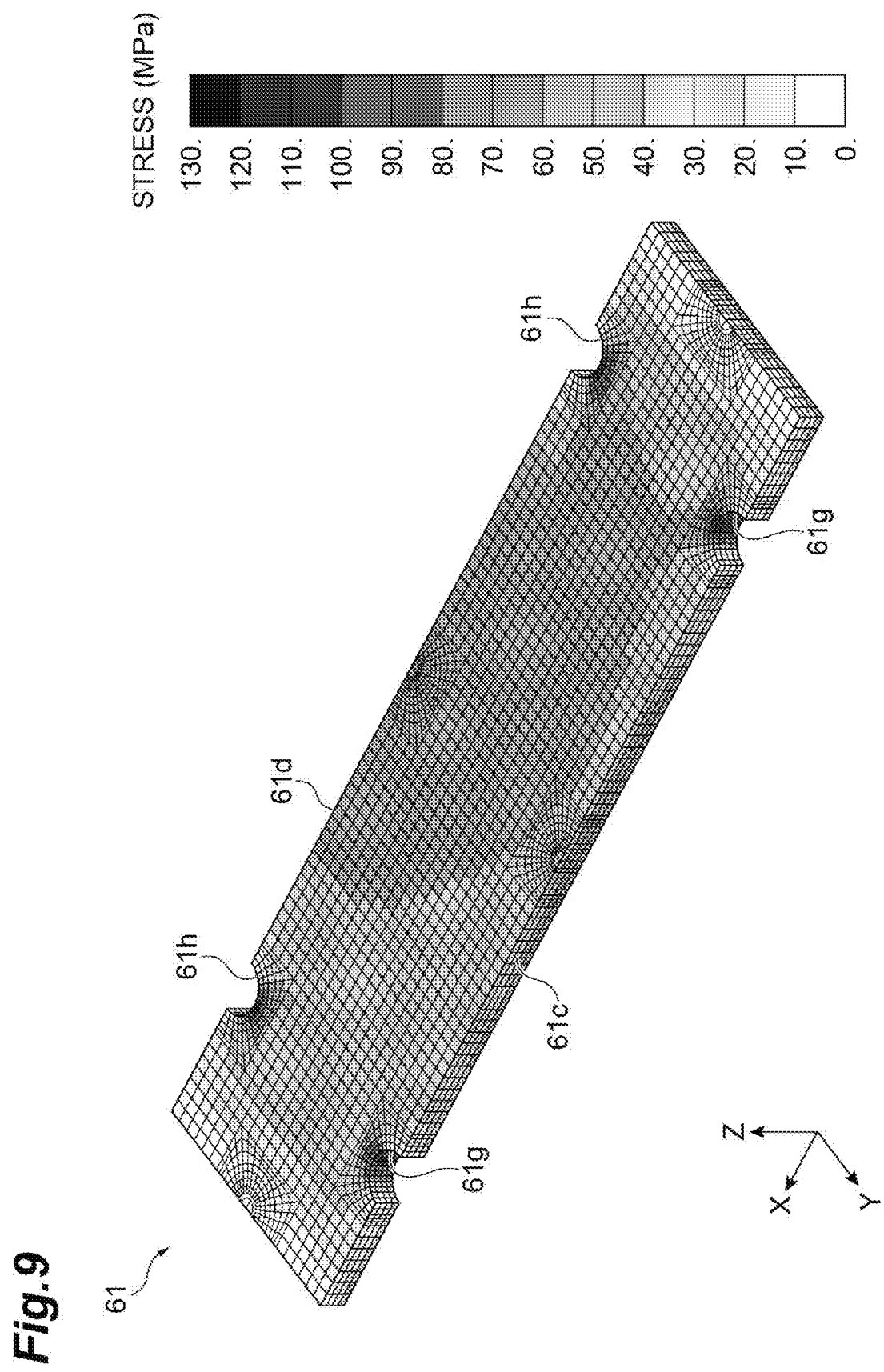
FIG. 9 is a diagram showing a stress distribution state of a dielectric substrate according to the modified example.

FIG. 9 is a diagram showing a stress distribution state of the dielectric substrate 61 according to the modified example. FIG. 9 shows the stress distribution state (simulation results) of the dielectric substrate 61 when it is affected by the temperature change from 25° C. to 125° C. In FIG. 9, illustration of other members is omitted. In FIG. 9, as in FIGS. 6 and 7, the stress is shown by contour lines, and as the color becomes darker, the stress increases.

When stress which may cause cracks occurs in the dielectric substrate 61, as shown in FIG. 9, it can be seen that a particularly large stress (a stress of 120 MPa or more and 130 MPa or less in the example of FIG. 9) occurs in the recess 61g and the recess 61h. As described above, since the large stress locally occurs, the recess 61g or the recess 61h preferentially serves as a starting point of the crack. Thus, also in the matching circuit 60, it is possible to control the location at which a crack occurs in the dielectric substrate 61 by the recesses 61g and 61h. Even when cracks occur in the dielectric substrate 61, cracks are prevented from reaching the resistance film 63, and thus the degree of loss of the function obtained by the resistance film 63 can be reduced. As a result, the function obtained by the resistance pattern can be maintained. In the matching circuit 60, when cracks occur in the dielectric substrate 61, cracks may reach the metal pad 62. On the other hand, since the metal pad 62 has a thickness larger than the thickness of the metal pad 42, even when it is desired to avoid the occurrence of cracks in the metal pad 62, it is possible to prevent the occurrence of cracks in the metal pad 62 by Au exerting viscosity.

The radio frequency amplification device 1 may include the matching circuit 60 instead of the matching circuit 50. Alternatively, the matching circuit 60 may be provided instead of the matching circuits 40 and 50.

Figure 10B:
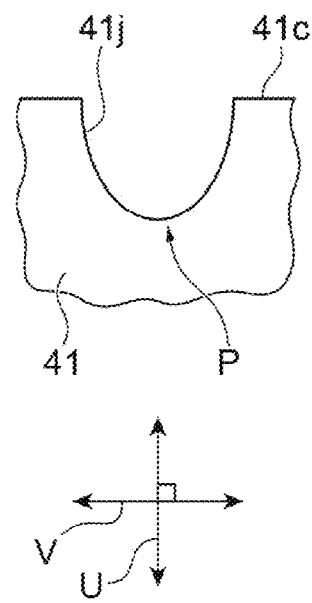
FIG. 10B is a diagram showing a recess according to the modified example.

Further, in the above-described embodiment and modified example, the planar shapes of the recesses 41g, 41h, 51g, 51h, 61g, and 61h are semicircular, but the planar shapes of the recesses (the first recess and the second recess) are not limited to such a configuration. FIGS. 10A, 10B and 10C are diagrams showing each of recesses 41i, 41j and 41k according to the modified example. Hereinafter, they are described as modified examples of the recess 41g, and may be modified examples of any of the recess 41g, 41h, 51g, 51h, 61g, and 61h.

As shown in FIG. 10A, a recess 41i (a first recess) of which a planar shape is a shape obtained by dividing an ellipse into two in a major axis direction may be provided in the side surface 41c. As shown in FIG. 10B, a recess 41j (a first recess) of which a plane shape is a shape obtained by dividing an ellipse into two in a minor axis direction may be provided in the side surface 41c. Alternatively, as shown in FIG. 10C, a recess 41k (a first recess) of which a planar shape is triangular may be provided in the side surface 41c. At top portions of the recesses 41g, 41i, 41j, and 41k in a direction U in which cracks are desired to occur in the dielectric substrate 41 (for example, a direction orthogonal to a main direction V in which tensile stress occurs), as a curvature of an apex P having a shape symmetrical with respect to the direction U becomes larger, the stress which occurs at the apex increases. That is, the stress which may locally occur in the dielectric substrate 41 having the recesses is likely to increase. The curvature of the apex P of the recess 41i is smaller than the curvature of the apex P of the recess 41g. Further, the curvature of the apex P of the recess 41j is larger than the curvature of the apex P of the recess 41g. Further, the curvature of the apex P of the recess 41k is larger than the curvature of the apex P of the recess 41j. Therefore, the recesses 41k, 41j, 41g, and 41i are likely to be the starting points of cracks in this order.

Instead of the recesses 41g, 41h, 51g, 51h, 61g, and 61h, the recesses 41i, 41j, and 41k may be arbitrarily adopted.

REFERENCE SIGNS LIST

1, 1X Radio frequency amplification device
2 Input terminal
3 Output terminal
4 Package
4a, 4b End wall
4c, 4d Side wall
4e Bottom plate (base substrate)
5 Housing
5a Bottom plate
9a to 9f Bonding wire
10 Amplification element part
11 Amplification element
20 Branch circuit board
21 Substrate
21a, 21b Long side
21c, 21d Short side
22 Branch circuit
23 Wiring pattern
23a Metal pad
23b Film resistance
30 Synthesis circuit board
31 Substrate
31a, 31b Long side
31c, 31d Short side
32 Synthesis circuit
33 Wiring pattern
33a Metal pad
33b Film resistance
40, 40X Matching circuit (matching circuit board)
41, 41X Dielectric substrate
41a Main surface (first main surface)
41b Main surface (second main surface)
41c Side surface (first side surface)
41d Side surface (second side surface)
41e End surface
41f End surface
41g, 41i, 41j, 41k Recess (first recess)
41h Recess (second recess)
42 Metal pad (circuit pattern)
50, 50X Matching circuit (matching circuit board)
51 Dielectric substrate
51a Main surface (first main surface)
51b Main surface (second main surface)
51c Side surface (first side surface)
51d Side surface (second side surface)
51e End surface
51f End surface
51g Recess (first recess)
51h Recess (second recess)
52 Metal pad (circuit pattern)
60 Matching circuit
61 Dielectric substrate
61c Side surface (first side surface)
61d Side surface (second side surface)
61g Recess (first recess)
61h Recess (second recess)
62 Metal pad (circuit pattern)
63 Resistance film (resistance pattern)
C crack
D1 to D4 Thickness
P Apex
U Direction
V Main direction
N1 to N3 line

The invention claimed is:

1. An amplification device comprising:
   a base substrate;
   an amplification element mounted on the base substrate; and
   a matching circuit board mounted on the base substrate and including a circuit pattern electrically connected to the amplification element,
   wherein the matching circuit board includes a first side surface and a second side surface each extending in a longitudinal direction of the matching circuit board,
   wherein the matching circuit board further includes a resistance pattern,
   wherein a first recess is provided in the first side surface, and a second recess facing the first recess is provided in the second side surface,
   wherein the first recess and the second recess are positioned to oppose each other in a direction orthogonal to the longitudinal direction,
   wherein the circuit pattern is located between the first recess and the second recess, and
   wherein the resistance pattern is not located between the first recess and the second recess.

2. The amplification device according to claim 1, wherein, in the longitudinal direction, the first recess and the second recess are separated from an end of the circuit pattern near the resistance pattern by a distance of half or more of a length of the circuit pattern in the longitudinal direction.

3. The amplification device according to claim 1, wherein, in the longitudinal direction, the first recess and the second recess are separated from an end of the circuit pattern near the resistance pattern by a distance of three quarters or more of a length of the circuit pattern in the longitudinal direction.

4. The amplification device according to claim 1,
   wherein the matching circuit board includes a dielectric substrate on which the circuit pattern is provided, and the first recess and the second recess are provided on the dielectric substrate, and
   wherein a material constituting the base substrate includes copper, and the dielectric substrate includes barium titanate.

5. The amplification device according to claim 4, wherein a thickness of the base substrate is 1 mm or more and 3 mm or less, and a thickness of the dielectric substrate is 0.1 mm or more and 0.5 mm or less.

6. A matching circuit board which is mountable on a base substrate and includes a resistance pattern and a circuit pattern to perform impedance conversion, the matching circuit board comprising:
   a first side surface and a second side surface each extending in a longitudinal direction of the matching circuit board,
   wherein a first recess is provided in the first side surface, and a second recess facing the first recess is provided in the second side surface,
   wherein the first recess and the second recess are positioned to oppose each other in a direction orthogonal to the longitudinal direction,
   wherein the circuit pattern is located between the first recess and the second recess, and
   wherein the resistance pattern is not located between the first recess and the second recess.

7. The matching circuit board according to claim 6, wherein, in the longitudinal direction, the first recess and the second recess are separated from an end of the circuit pattern near the resistance pattern by a distance of half or more of a length of the circuit pattern in the longitudinal direction.

8. The matching circuit board according to claim 6, wherein, in the longitudinal direction, the first recess and the second recess are separated from an end of the circuit pattern near the resistance pattern by a distance of three quarters or more of a length of the circuit pattern in the longitudinal direction.

9. The matching circuit board according to claim 6, further comprising a dielectric substrate on which the circuit pattern is provided, and
   wherein the first recess and the second recess are provided on the dielectric substrate, and the dielectric substrate includes barium titanate.

10. The matching circuit board according to claim 9, wherein a thickness of the dielectric substrate is 0.1 mm or more and 0.5 mm or less.

* * * * *